July 14, 1959 F. T. KSIAZEK 2,895,020

PRINTED CIRCUIT FOR MULTI-STAGE WAVE AMPLIFIER

Filed Feb. 19, 1954 3 Sheets-Sheet 1

INVENTOR.
FRANK T. KSIAZEK
BY
[signature]

July 14, 1959 F. T. KSIAZEK 2,895,020

PRINTED CIRCUIT FOR MULTI-STAGE WAVE AMPLIFIER

Filed Feb. 19, 1954 3 Sheets-Sheet 2

INVENTOR.
FRANK T. KSIAZEK
BY
[signature]

July 14, 1959 F. T. KSIAZEK 2,895,020

PRINTED CIRCUIT FOR MULTI-STAGE WAVE AMPLIFIER

Filed Feb. 19, 1954 3 Sheets-Sheet 3

INVENTOR.
FRANK T. KSIAZEK
BY
[signature]

United States Patent Office 2,895,020

Patented July 14, 1959

2,895,020

PRINTED CIRCUIT FOR MULTI-STAGE WAVE AMPLIFIER

Frank T. Ksiazek, Pennsauken, N.J., assignor to Radio Corporation of America, a corporation of Delaware Application February 19, 1954, Serial No. 411,443

5 Claims. (Cl. 179—171)

The present invention relates to new and improved printed circuitry for a signal wave amplifier and, more particularly, though not necessarily exclusive, to a printed circuit for use as a multi-stage, intermediate frequency (I.F.) amplifier.

Printed circuits are considerably less expensive than conventional circuits which employ separately wound coils, transformers and the like which are joined by wire conductors, the cost reductions arising from the fact that the components as printed are far less expensive than conventional components and from the additional fact that electrical connections are more easily affected. By virtue of certain inherent characteristics of printed circuits, however, their use has been restricted to an extent which precludes the realization of their full advantage. One salient problem stems from the fact that a plurality of printed amplifier stages on the same board are ordinarily subject to undesirable feedback and regeneration, particularly, as caused by "linking currents" and radiation. Thus, for example, while printed transformers are known in the art, commercial receiver designers have found it impractical to print such transformers on the same support or "board," since the flux lines of one tend to cut across the conductors of another thereby introducing feedback. Moreover, feedback has also been found to result when a common conductor is used, for example, as a "ground" bus for a plurality of amplifier stages, since the ground currents of the several stages mingle and interact within the conductor.

It is, therefore, a primary object of the present invention to provide new and improved printed circuitry for use in a multi-stage amplifier strip, the stages of which are transformer-coupled, and which is substantially free of regenerative effects.

Another object of the invention is the provision of a multi-stage amplifier which is substantially immune to the regeneration which heretofore has resulted from linking currents.

In accordance with a specific form, the present invention is embodied in a television receiver intermediate frequency amplifier having a plurality of transformer-coupled stages. The several coupling transformers are printed on the same support and are isolated from each other through a novel arrangement of conductive areas which are connected to the receiver chassis (i.e., "ground") and which are disposed in a special relationship with respect to the transformers. The final amplifier stage is effectively isolated from preceding stages, both as to radiation and linking currents, through the agency of a separate conductive area on the printed circuit support, which area also is a grounding point for the output transformer. Additional isolation is afforded by means of chokes printed on the board and connected between the filaments of the several amplifier tubes.

Hence, it is a further object to provide a novel printed circuit I.F. amplifier strip for a television receiver, said strip being printed in substantially its entirety on a single support and having discrete conductive areas which serve to shield the several stages and as ground buses therefor.

Additional objects and advantages of the present invention will become apparent to persons skilled in the art from a study of the following detailed description of the accompanying drawing, in which.

Figure 1:
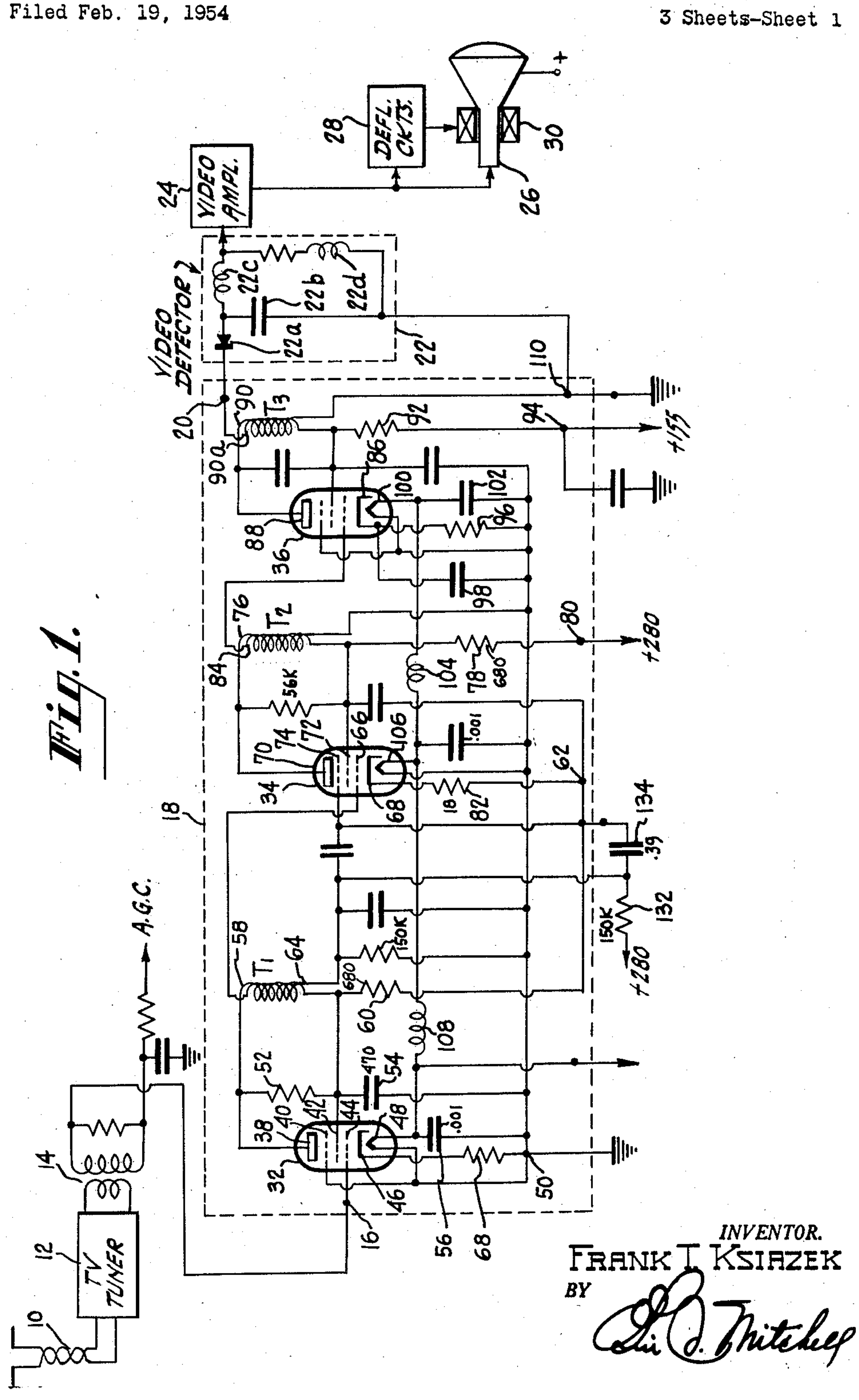
Figure 1 is a schematic diagram representative of a television receiver including an I.F. strip, the printed circuitry of which constitutes the present invention.

In order to simplify the description of the present invention and to render the printed circuit more readily understandable, the operational aspects of the I.F. amplifier strip in which the invention is embodied will be described. In Figure 1 there is illustrated a television receiver including an antenna 10 which intercepts television carrier waves and applies them to a tuner 12 which may, for example, comprise the usual radio frequency (R.F.) stages and mixer. The output of the tuner 12 is coupled by a transformer 14 to the input terminal 16 of the I.F. amplifier which is enclosed in the dashed line rectangle 18. The intermediate frequency waves after amplification, are available at the output terminal 20 of I.F. amplifier 18 and are applied to a video detector illustrated schematically within the dashed line rectangle 22. The composite video signal is, after detection, amplified by means such as is indicated by block 24 and applied to the intensity-controlling electrode (not shown) of a kinescope 26. The video signal is also applied to deflection circuit 28 which serves to drive sawtooth deflection currents of horizontal and vertical frequencies through the electromagnetic yoke 30 associated with the kinescope.

Referring more particularly to the I.F. amplifier 18, it may be seen from Figure 1 that the strip comprises three electron tube amplifiers 32, 34, and 36 of the pentode variety. Amplifier 32 includes anode 38, suppressor grid 40, screen grid 42, control grid 44, and a cathode 46 which is indirectly heated by a filament 48. The suppressor grid 40 and one end of the filament 48 are connected to each other and to ground reference potential at point 50. The screen grid 42 is connected to the anode 38 through a resistor 52 and is bypassed to ground by means of a capacitor 54. The end of filament 48 remote from that end which is connected to ground with the suppressor grid, is also connected to ground through a bypass capacitor 56. The anode 38 of tube 32 includes in its circuit the primary winding 58 of a bifilar transformer $T_1$, the other end of which is connected through resistor 60 to terminal 62.

The secondary winding 64 of transformer $T_1$ couples energy to the input or control grid 66 of amplifier 34 in a conventional manner. Amplifier 34 includes, as shown, a cathode 68, anode 70, and screen and suppressor grids 72 and 74, respectively. The anode 70 of amplifier 34 is connected through the primary winding 76 of a second bifilar transformer $T_2$ and a resistor 78 to B+ terminal 80 which is, as shown, connected to a source of operating potential of +280 volts. The cathode 68 of amplifier 34 is also connected through a resistor 82 to point 62, so that it should be apparent that amplifier 32 and 34 are "stacked" insofar as direct current operating potentials are concerned. That is to say, the resistance of tube 34 and its space current circuit serves as a voltage dropping means for applying the necessary B+ potential at terminal 62 to the anode of tube 32. Aside from the mode of furnishing the operating potential to amplifier 32 and 34, their operational aspects should be apparent to those skilled in the art.

Amplifier 36 is inductively coupled by means of winding 84 of transformer $T_2$ to the preceding amplifier stage. Amplifier 36 also includes a cathode 86, an anode 88, and control, screen and suppressor grids. The anode of tube 36 is connected through the primary winding 90 of a bifilar output transformer $T_3$ and resistor 92 to terminal 94 which is connected to a source of +155 volts. The cathode 86 of tube 36 is connected to ground through a parallel combination of resistor 96 and capacitor 98 which serves to furnish self-biasing for that tube. Cathode 86 is indirectly heated by means of a filament 100, one end of which is connected to ground together with the suppressor grid of the tube and the other end of which is connected to ground through a bypass capacitor 102 and, through a choke inductance 104, to the filament 106 of tube 34. The junction of filament 106 and choke 104 is also connected through a secondary choke inductance 108 to the filament 48 of tube 32. Chokes 104 and 108 serve, by virtue of their connection between the filaments of the three tubes, to prevent feedback of the signal frequencies between the tubes, as will be understood by persons skilled in the art. From the foregoing, it will be appreciated that the I.F. signal applied to terminal 16 of the strip 18 is successively amplified by tubes 32, 34, and 36 whereby to provide at terminal 20 at the end of secondary winding 90*a* of transformer $T_3$ the greatly amplified I.F. signal. The end of winding 90*a* of transformer $T_3$ remote from terminal 20 is connected to terminal 110, which is, in turn, connected to ground. It should be borne in mind that the term "ground' as employed herein refers to a point of reference potential such as is available by connection to the chassis of the receiver.

As will be apparent to persons familiar with the problems of commercial receiver production, the various components of I.F. amplifier strip 18 would, if of conventional (i.e. unprinted) form, be extremely expensive both as to component cost and assemblage. Thus, as has been stated, the present invention provides a printed circuit which contains substantially all of the components contained within rectangle 18 of Figure 1 except for the resistors and capcitors and, of course, the electron tubes themselves.

Figure 2:
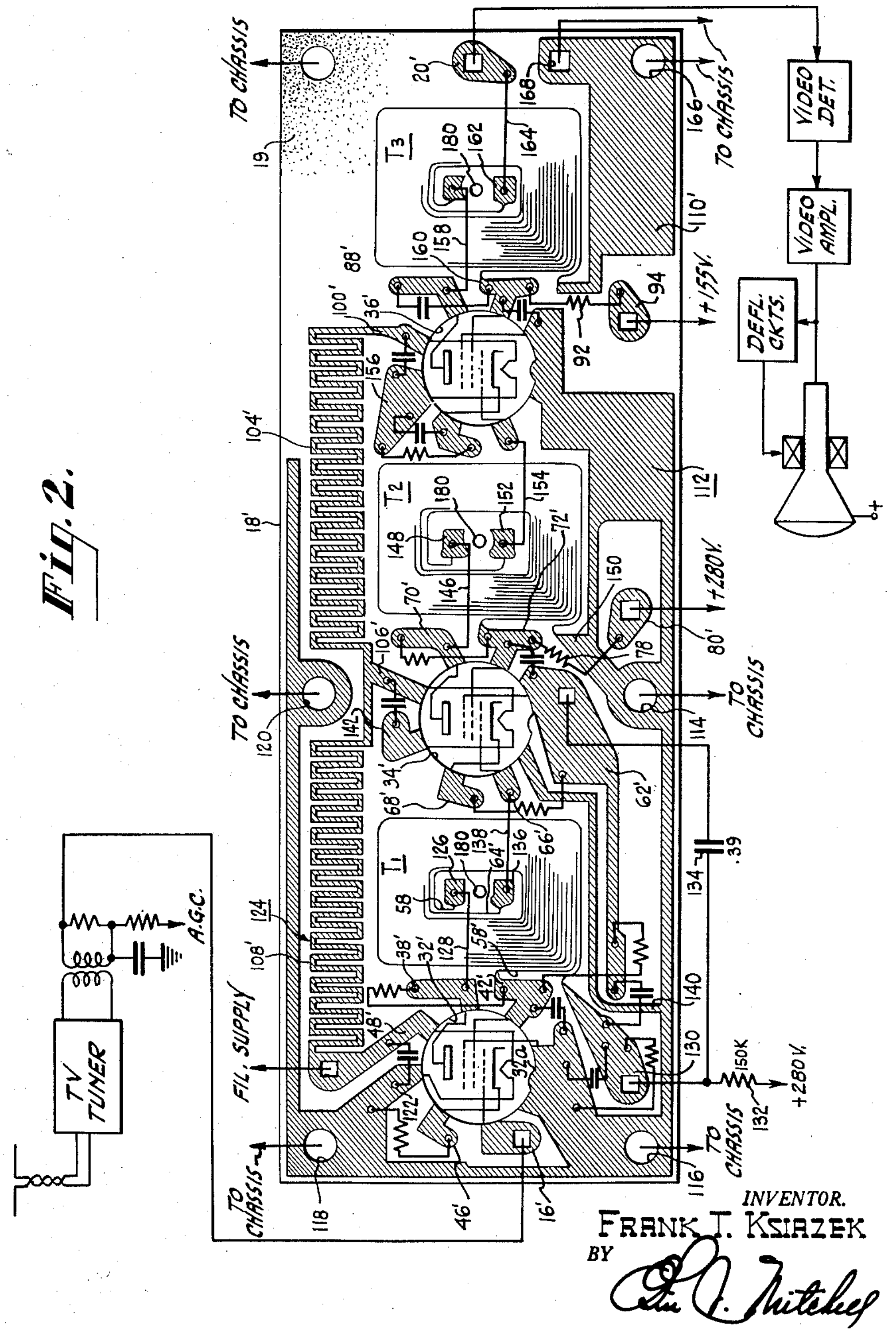
Figure 2 is a plan view of a printed circuit I.F. strip schematically connected to related portions of a television receiver.

In Figure 2, therefore, there is illustrated a printed circuit I.F. strip 18' which corresponds, element for element, to the I.F. strip 18 of Figure 1. In order to point up the corresponding components of the two figures, where possible the same reference numerals are employed in Figure 2 as were used in Figure 1 with the prime (') notation. The other portions of the television receiver, shown in diagrammatic form Figure 1, are also shown in Figure 2 for the purpose of further clarifying the environment of the invention.

While the specific manner of producing the printed circuit I.F. strip 18' does not constitute a part of present invention, the strip may take the form of a board or support made of phenolic or other insulating material 19 having sufficient mechanical strength and rigidity to support the various components. In the drawing, the insulating material 19 is illustrated by the unlined regions, while the conductive areas which may, for example, comprise a copper film of suitable configuration, are illustrated by the lined regions. The board is provided with three substantially circular apertures 32', 34' and 36' having inwardly projecting "keys," as shown, for aligning conventional electron tube sockets of the miniature variety in proper relation to the board. That is to say, the key 32*a* of aperture 32' locates a tube socket within the aperture in such manner that each of the tube pin contact terminals is properly located in alignment with each of the contact terminal tabs arranged radially about the aperture. The keys of the other apertures 34' and 36' serve the same purposes for their respective tubes. Tab 16' on strip 18' corresponds to the input terminal of the I.F. strip and is located with respect to aperture 32' such that the contact terminal for the control grid of tube 32 is in electrical contact therewith. In a similar manner, tab 46' contacts the cathode of tube 32, while tabs 38' and 42' contact its anode and screen grid respectively. A conductive layer of copper or the like "printed" onto the phenolic support 19 is indiacted by reference numeral 112 and extends, as shown, from the region immediately surrounding the bottom portion of aperture 36' around the locations of apertures 34' and 32' to a point above those apertures and to the right thereof. Conductive area 112 contains circular apertures 114, 116, 118 and 120 which are adapted to receive bolts or other means for securing the strip 18' to the chassis (not shown) of the receiver. In this manner, area 112 is effectively connected electrically to the chassis or "ground."

An extension 122 of ground area 112 reaches a point on the aperture 32' for contact with one terminal of the filament of tube 32, as illustrated. The other terminal of the filament makes electrical contact with a tab 48' which constitutes the terminus of a conductive printed area 124 which has such configuration as to provide inductance. That is to say, the conductive area 124 comprises, in effect, a "zigzag" pattern having rectangular turns, such as to describe a "square wave" pattern. It has been found that, for a given available area, the pattern as shown at 124 affords the greatest value of inductance, greater even than a sinusoidal or "sawtooth" configuration would afford. While it has been known in printed circuitry to print an inductance on a flat support in the form of a spiral having rectangular turns, that is beginning at a central point and winding outward along ever-increasing radii, the configuration 124 possesses the extremely advantageous feature of requiring no additional jumper leads or wire conductors for connecting to the end of the inductance. Thus, it will be understood that the configuration indicated by area 124 constitutes the inductance or choke 108', one end of which is connected via tab 48' to the filament of tube 32, and the other end of which is connected via tab 106' to one end of the filament of tube 34. The remaining portion of the square wave configuration constitutes inductance 104' and terminates in a tab 100' for connection to the filament of tube 36. From the foregoing, it should be apparent that the filament chokes 104' and 108' as printed on the board 19 require no external leads for connection to the tube filaments, such connections being available through the printed tabs 48', 106' and 100'. Moreover, as pointed out supra, the chokes 104' and 108' serve to prevent feedback of the signal frequencies through the tube filaments.

Also printed on board 19 and between the locations of the tube receiving apertures 32' and 34' is a bifilar transformer $T_1$. The two ends of its primary winding 58' terminate, respectively, in the tabs 42' and 126. The anode of tube 32 is connected to one end of the primary winding 58' (i.e. tab 126) through tab 38' and a jumper or wire conductor 128. The other end of the primary winding 58' is connected to the screen grid of tube 32 through the contact tab 42'. The secondary winding 64' of transformer $T_1$ terminates at one end in a tab 130 which is connected through resistor 132 to a source of +280 volts, which resistor and source are indicated in Figure 1 by the same reference characters. Tab 130 is also connected through a capacitor 134 to a printed area 62' which will be described further hereinafter. The other end of secondary winding 64' terminates in a tab 136 which is connected via a jumper lead 138 to a tab 66' adjacent the aperture 34' whereby to make electrical contact with the control grid of tube 34. Also printed on the phenolic support 19 as an extension of the ground area 112 is a conductive strip 140 which extends vertically and horizontally to the right beneath the transformer $T_1$ and thence vertically and diagonally to the right to terminate at the aperture 34'. The purpose of the extension 140 will be more fully apparent later, but it is to be noted at this point that, by reason of the fact that the extension 140 particularly surrounds transformer $T_1$, shielding of the radiation from the transformer is afforded. That is to say, and this statement is equally applicable to the other ground area surrounding the other transformers, since the transformer and the ground areas are printed on the same support and lie in the same plane, there exists what may be termed a "planar" effect whereby radiations from the transformer are shielded by the ground strip and are presented from extending into areas on which the other transformers are printed.

Extending radially outwardly from aperture 34′ are conductive tabs 68′, 142, 70′ and 72′, in addition to those already mentioned. These tabs make electrical contact with the cathode, filament, anode and screen grid of tube 34, respectively. The anode of tube 34 is, in a manner similar to that described with respect to the anode of tube 32, connected to one end of the primary winding of transformer $T_2$ via tab 70′, jumper 146 and tab 148. The screen grid tab 72′ is connected to the other end of the primary winding of transformer $T_2$ and is further connected via resistor 78 to terminal 80′ which is connected to a source of positive potential of +280 volts. It should be noted that, in order for the ground area 112 to surround as much of transformer $T_2$ as is practicable within the limits established by the several tabs, the B+ terminal tab 80′ is printed within a cutout region of the ground area 112. The lower end of the secondary winding of transformer $T_2$ is connected at point 150 to the ground area 112, while the other end of the secondary winding, terminating in a tab 152, is connected through a jumper 154 to the control grid tab of tube 36. Since the contact tabs surrounding aperture 36′ are substantially the same both as to location and function as those described with respect to aperture 34′, they need not be described further. It should be pointed out, however, that tab 100′ is connected to the end of inductance 104′ and makes electrical contact with one end of the filament of tube 36. Also, there is provided a tab 156 adjacent aperture 36′ for contacting the other end of the filament of tube 36.

The anode of tube 36 is connected to one end of the primary winding of output transformer $T_3$ by means of conductive tab 88′ and jumper 158, while the other end of the primary winding terminates in a tab 160 which makes electrical contact with the screen grid of tube 36. Tab 160 is further connected through resistor 92 to a terminal tab 94 which is, in turn, connected to a source of +155 volts. Insofar as the secondary winding of output transformer $T_3$ is concerned, it is to be noted that one end thereof terminates in a tab 162 which is connected via jumper 164 to the output terminal 20′. The end of the secondary winding of transformer $T_3$ remote from the least recited end terminates in the ground region 110′ which, as shown, is generally rectangular and surrounds the bifilar transformer $T_3$ about a portion of its periphery. Ground area 110′ is apertured at 166 to provide an opening through which a bolt or other securing means may be passed for mechanically and electrically connecting that corner of the strip to chassis. Also, ground area 110′ includes the rectangular hole 168 which, in practice, may accommodate a terminal post to which may be soldered a wire for making a second connection to the chassis, whereby to insure proper grounding of the area. As has been stated earlier, the ground area 110′ which serves the secondary winding of the output transformer $T_3$ is separate from the first named grounding area 112 and is spaced therefrom. Moreover, area 110′ partially surrounds transformer $T_3$ whereby to provide further shielding and isolation of the output stage from the preceding stages. That is to say, the fact that area 110′ is separate from area 112 prevents regeneration between the output and earlier stages of the I.F. strip which might otherwise result from the linking currents referred to supra. Although both areas 110′ and 112 are connected to the same chassis, such connection is made at points which are spaced a substantial distance from each other, so that the regenerative effects which are produced by convention common wiring or which would result from the use of a continuous ground area serving all three stages are precluded. In addition to the isolation afforded with regard to the linking currents, the ground area 110′ effectively minimizes the effects of radiation which would otherwise come about through the flux lines of the output transformer cutting across the conductors of the preceding transformers.

Referring again to Figure 1, it is seen that the video detector 22 comprises a diode 22*a*, a filter capacitor 22*b* and series and shunt peaking coils 22*c* and 22*d*, respectively. Since, in the normal operation of a detector of the type in question, clipping of the carrier waves results in the production of harmonics, and since certain of the harmonics fall within the frequency band of television broadcast channels other than that being received, such harmonic currents are capable of producing deleterious effects if permitted to enter the video amplifier or other circuits of the receiver. Thus, both the capacitor 22*b* and coil 22*d* are returned to ground at terminal 168 of the ground area 110′. In this manner, the harmonic currents are effectively isolated from succeeding circuits of the receiver. With further reference to the ground area 112, it should be noted that it surrounds the first and second amplifier locations of the strip as nearly as is possible within the limits set by the existence of the other conductive areas. While even more perfect shielding of radiation might be realized through complete surrounding of the stages by a continuous ground area, the present applicant has found that the slightly decreased shielding effects are more than compensated for by the fact that fewer exterior jumper leads are required in the present arrangement.

In the interest of completeness of description, and as may be seen by tracing through the circuitry of Figure 2 as compared with the schematic diagram of Figure 1, it is seen that conductive tabs 142 (adjacent aperture 34′) and 156 (adjacent aperture 36′) must be returned to ground potential in order to complete the path for the filament of tubes 34 and 36. Since the complete path to ground cannot be seen from the illustration of Figure 2, Figures 3, 4 and 5 illustrate, respectively, and by way of fragmentary views those portions of the strip 18′ immediately surrounding the tube apertures 32′, 34′ and 36′. As may be seen from these figures, each aperture receives a tube socket such as those designated 32″, 34″ and 36″. Each of the tube sockets, moreover, is provided at its bottom end with conductive terminal strips 170 for connecting the tube pin terminals to the contact tabs which are printed on the board. Additionally, and as will be understood, it is necessary for each of the tube sockets to be grounded. Thus, each socket is provided with a central eyelet or rivet 172 which extends axially therethrough and which holds radially extending jumper straps 174 which are, in turn, electrically connected, as by soldering, to adjacent conductive areas of the board. Thus, as shown in Figure 4, eyelet 172 of the tube socket holds jumper straps 174 securely in place whereby to define an electrically conductive path between tab 34′ and the ground extension 140. This, it will be noted, completes the direct current path between the filament of tube 34 and ground area 112. Similarly, in Figure 5, eyelet 172 supports jumper straps 174 to make an electrical path between tab 156 and the lower right hand extremity of ground 112, thereby affording the direct current path for the filament of tube 36.

Figure 3:
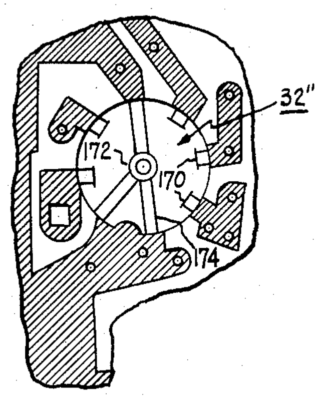
Figures 3, 4 and 5 are fragmentary plan views of selected regions of the printed circuit strip of Figure 2.
Figure 4:
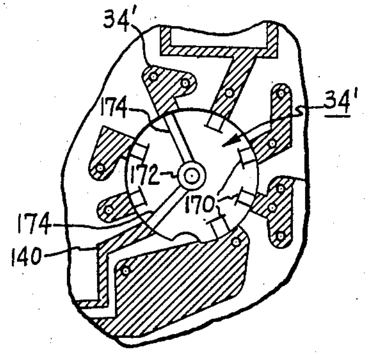
Figure 5:
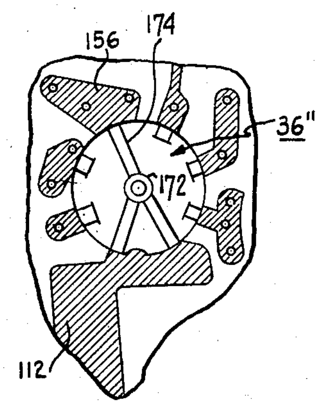

While they do not constitute a part of the present invention, shield "cans" of well known variety may be mounted on the electron tubes and connected to ground through one of the jumper straps such as those shown at 174 in Figures 3, 4 and 5. Additionally, a shielding "plate" may be mounted on that side of each tube remote from the shielding cans, which plate may be in a plane perpendicular to the plan of the printed circuit board. Mechanical mounting means for such plates may take the form of a pin adapted to be inserted into the eyelet 172. Also not a part of the invention are tuning means for the several transformers. Such means may take the form of a metal plate carried by a threaded bolt which is threadably received by an aperture centrally located within each transformer location. Such apertures are shown at 180 in Figure 2.

By way of summary, therefore, it will be seen that the present invention affords a simplified printed circuit, multistage, I.F. amplifier for a television receiver, which circuit has printed on a single support all of the electrical elements necessary for operation of the amplifier, with the exception of resistors, capacitors and the tube themselves. Moreover, by virtue of the novel configuration of the ground areas and the fact of there being separate, optimum isolation between the output stage and preceding stages is afforded. Further, the printed inductance chokes of a square wave configuration afford additional isolation of the several stages in a manner requiring no separate connecting leads, while furnishing the maximum value of inductance for the area available.

Since, as has been set forth earlier, the specific mode of preparing the printed circuit does not form a part of the present invention, any suitable process may be employed. One highly effective technique, however, is to first secure a metal foil about 1.5 mils (0.0015 inch) thick to a substantially non-conductive carrier sheet. Copper foil on a polymerized phenolformaldehyde resin sheet produces excellent results. The exposed foil surface is then coated with any suitable photo-sensitive layer of the type generally employed in the photo-engraving art. The standard alkaline solution of bichromated shellac commonly known as cold top enamel makes a suitable coating. The coating is kept in subdued light till it is exposed to an intense image of the desired circuit, the conductive circuit portions being light and the background being dark. After a sufficient exposure time, the photo-sensitive coating is treated with a developer, essentially ethyl alcohol where cold top enamel is the photosensitive coating, which softens those parts of the coating that have not been exposed to the intense light. The developed coating is then washed in running water, which washes off the softened portions. The washing may be assisted by some mechanical rubbing, as with a sponge, to completely detach loose portions. The sheet with the remaining portions of the coating is then subjected to an etching treatment, preferably of the spray type, in which etching fluid that dissolves the metal foil is sprayed against the partially coated surface to be etched. The metal is thereby dissolved from all portions unprotected by cold top enamel, leaving an accurate reproduction of the photographic image.

It should be borne in mind that, while the term "printed" has been employed throughout the present specification, that term as used herein and in the claims is to be understood as including any structure wherein conductive areas are located on a non-conductive or insulating support, regardless of what the specific mode of producing the areas on the spot may be.

Having thus described my invention, what I claim as new and desire to secure by Letters Patent is:

1. A printed circuit multi-stage signal amplifier of the type having electrically conductive areas arranged on a planar insulating support adapted to be mounted on a conductive chassis, which amplifier comprises: a plurality of amplifier stage locations, on said support each including an aperture for receiving an electron tube support of the type having a plurality of radially disposed pin sockets; a plurality of conductive tabs on said support surrounding each such aperture and extending radially outwardly therefrom, said tabs being angularly separated in such manner that each tab is adapted to be in radial alignment with one of such pin sockets; an output terminal printed on said support adjacent one edge thereof; a plurality of coupling transformers printed on said support in such manner as to provide transformer coupling between successive ones of such amplifiers and between said output terminal and the final one of said amplifiers; means providing a first discrete conductive area disposed about the margin of said support and substantially surrounding the circuitry thereon to a point adjacent said final amplifier location; and means providing a second discrete conductive area on said support spaced from said last-named area and partially surrounding said transformer coupling said output terminal to the final one of said amplifiers, said first conductive area, said second conductive area and said plurality of printed coupling transformers all being disposed in substantially coplanar relationship on said insulating support.

2. The invention defined by claim 1 wherein said support further includes a conductive pattern of square-wave configuration, and additional conductive areas on said support joining selected points in said square-wave configuration to certain of said conductive tabs.

3. A printed circuit structure of the type providing regions of conductive material on a flat insulating support adapted to be mounted on a conductive chassis, and for use in a multi-stage signal amplifier including an input amplifier stage and an output amplifier stage, said structure comprising means defining an input amplifier stage location on said insulating support, means defining an output amplifier stage location on said insulating support, an output terminal, means providing electrical coupling between said input amplifier stage and said output amplifier stage and comprising an interstage coupling transformer printed on said insulating support intermediate said input amplifier stage location and said output stage location, means providing electrical coupling between said output amplifier stage and said output terminal and comprising an output transformer printed on said insulating support intermediate said output amplifier stage location and said output terminal and remote from said printed interstage coupling transformer, means providing a first continuous region of conductive material on said insulating support disposed in the same plane as said printed transformers such as to encircle to a substantial degree an area on said insulating support occupied by at least said input amplifier stage location and said printed interstage coupling transformer, means including said first region of conductive material for grounding said input amplifier stage to a first point on said chassis, means providing a second region of conductive material spaced from said first region on said insulating support and disposed in the same plane as said printed transformers such as to partially surround an area on said insulating support occupied by at least said printed output transformer, and means including said second region of conductive material and excluding said first region of conductive material for grounding said output transformer to a second point on said chassis remote from said first point.

4. In a television intermediate frequency amplifier comprising an input amplifier stage and an output amplifier stage, a printed circuit structure of the type providing regions of conductive material on a flat insulating support adapted to be mounted on a conductive chassis, said structure comprising means defining an input amplifier stage location on said insulating support, means defining an output amplifier stage location on said insulating support, an output terminal, means providing electrical coupling between said input amplifier stage and said output amplifier stage and comprising an interstage coupling transformer printed on said insulating support intermediate said input amplifier stage location and said output stage location, means providing electrical coupling between said output amplifier stage and said output terminal and comprising an output transformer printed on said insulating support intermediate said output amplifier stage location and said output terminal and remote from said printed interstage coupling transformer, and means for minimizing undesired signal feedback from said output transformer to said input amplifier stage and associated interstage coupling transformer; said last-named means comprising means providing a first discrete region of conductive material on said insulating support disposed in coplanar relationship with said printed transformers, extending such as to surround to a substantial degree an area on said insulating support occupied by at least said input amplifier stage location and said printed interstage coupling transformer, and adapted to be grounded to said chassis; and means providing a second discrete region of conductive material spaced from said first region on said insulating support, disposed in coplanar relationship with said printed transformers, extending such as to partially surround an area on said insulating support occupied by at least said printed output transformer, and adapted to be independently grounded to said chassis.

5. Apparatus in accordance with claim 4 wherein said input amplifier stage and said output amplifier stage each comprise an electron discharge device including a filament, and wherein said feedback minimizing means also includes an area of conductive material disposed on said insulating support in a pattern of square-wave configuration intermediate said input amplifier stage location and said output amplifier stage location, and means for electrically connecting said square-wave pattern area of conductive material between the respective filaments of said input and output amplifier stage devices.

References Cited in the file of this patent

UNITED STATES PATENTS

| | | |
|---|---|---|
| 2,268,619 | Reid | Jan. 6, 1942 |
| 2,441,960 | Eisler | May 25, 1948 |
| 2,492,235 | Mitchell | May 30, 1949 |
| 2,706,697 | Eisler | Apr. 19, 1955 |
| 2,718,623 | Yoder et al. | Sept. 20, 1955 |
| 2,796,470 | Gossard | June 18, 1957 |

UNITED STATES PATENT OFFICE

CERTIFICATE OF CORRECTION

Patent No. 2,895,020 July 14, 1959

Frank T. Ksiazek

It is hereby certified that error appears in the printed specification f the above numbered patent requiring correction and that the said Letters atent should read as corrected below.

Column 4, line 9, for "indiacted" read -- indicated --; column 5, Line 11, for "presented" read -- prevented --.

Signed and sealed this 5th day of April 1960.

(SEAL)
ttest:

KARL H. AXLINE
ttesting Officer

ROBERT C. WATSON
Commissioner of Patents